US009887552B2

(12) United States Patent
Engel et al.

(10) Patent No.: US 9,887,552 B2
(45) Date of Patent: Feb. 6, 2018

(54) FINE TIMING ADJUSTMENT METHOD

(71) Applicant: ANALOG DEVICES, INC., Norwood, MA (US)

(72) Inventors: Gil Engel, Lexington, MA (US); Steven C Rose, Woburn, MA (US); Matthew Louis Courcy, Fremont, NH (US)

(73) Assignee: ANALOG DEVICES, INC., Norwood, MA (US)

( * ) Notice: Subject to any disclaimer, the term of this patent is extended or adjusted under 35 U.S.C. 154(b) by 374 days.

(21) Appl. No.: 13/829,889

(22) Filed: Mar. 14, 2013

(65) Prior Publication Data

US 2014/0265578 A1  Sep. 18, 2014

(51) Int. Cl.
*H02J 4/00* (2006.01)
*H03M 1/10* (2006.01)
*H03M 1/74* (2006.01)
*H03M 1/12* (2006.01)
*H03M 1/66* (2006.01)

(52) U.S. Cl.
CPC ............. *H02J 4/00* (2013.01); *H03M 1/1009* (2013.01); *H03M 1/121* (2013.01); *H03M 1/662* (2013.01); *H03M 1/742* (2013.01); *Y10T 307/492* (2015.04)

(58) Field of Classification Search
CPC ...... H03M 1/0607; H03M 1/1009; H03B 1/00
See application file for complete search history.

(56) References Cited

U.S. PATENT DOCUMENTS

| 5,945,863 | A  | * | 8/1999  | Coy ....................... H03K 5/151 327/246 |
| 6,194,962 | B1 | * | 2/2001  | Chen ..................... H03F 3/4521 330/253 |
| 6,501,314 | B1 | * | 12/2002 | Ling ................ H03K 3/356043 327/202 |
| 6,535,534 | B1 | * | 3/2003  | Fischer .................. H01S 5/042 372/38.02 |
| 6,617,926 | B2 | * | 9/2003  | Casper ................ H03F 3/45183 326/115 |
| 6,819,155 | B1 | * | 11/2004 | Ling et al. .................... 327/175 |

(Continued)

OTHER PUBLICATIONS

Hittite,"The impact of Clock generator Performance on Data Converters", Jul. 2012, Electronic Products, p. 1-4.*

(Continued)

*Primary Examiner* — Thienvu Tran
*Assistant Examiner* — Pinping Sun
(74) *Attorney, Agent, or Firm* — Patent Capital Group

(57) ABSTRACT

Embodiments of the present invention may provide non-invasive techniques for adjusting timing in multistage circuit systems. A multistage circuit system according to embodiments of the present invention may include a plurality of circuit stages coupled to signal lines that carry signals. The system may also include a plurality of load circuits, one provided in for each circuit stage. The load circuits may have inputs coupled to the signal lines that carry the input signals. Each load circuit may include a current source programmable independently of the other load circuits that propagates current through an input transistor in the respective load circuit that receives the signal. The current propagating through the input transistor may provide a load on the corresponding signal line, allowing fine timing adjustment for each circuit stage.

19 Claims, 4 Drawing Sheets

(56) References Cited

U.S. PATENT DOCUMENTS

| | | | |
|---|---|---|---|
| 6,919,833 B2 * | 7/2005 | Mills | H03M 1/0643 341/118 |
| 7,049,889 B2 * | 5/2006 | Kalb | H03F 1/301 330/253 |
| 7,071,858 B2 * | 7/2006 | Pan | H03K 19/1738 327/359 |
| 7,193,468 B2 * | 3/2007 | Kwon et al. | 330/260 |
| 7,323,939 B2 * | 1/2008 | Han | H03F 1/223 330/305 |
| 7,425,909 B2 * | 9/2008 | Rose et al. | 341/135 |
| 7,545,194 B2 * | 6/2009 | Chen et al. | 327/276 |
| 7,598,788 B2 * | 10/2009 | Cao | 327/266 |
| 7,668,153 B2 * | 2/2010 | Zavadsky | 370/350 |
| 7,720,015 B2 * | 5/2010 | Gupta | H04B 3/23 370/286 |
| 7,755,421 B2 * | 7/2010 | Chen | H03F 3/45973 330/9 |
| 8,536,944 B2 * | 9/2013 | Spaeth | H04L 25/0282 330/252 |
| 2004/0164802 A1 * | 8/2004 | Hughes | H03F 3/4508 330/261 |
| 2005/0015638 A1 * | 1/2005 | Zhang | H03K 3/356043 713/600 |
| 2006/0072232 A1 * | 4/2006 | Fischer | G11B 5/02 360/46 |
| 2006/0238235 A1 * | 10/2006 | Wey | G05F 3/265 327/543 |
| 2008/0012653 A1 | 1/2008 | Chen et al. | |
| 2012/0314753 A1 * | 12/2012 | Lee | H04L 25/03159 375/229 |
| 2014/0029143 A1 * | 1/2014 | Lim | H03F 1/523 361/56 |

OTHER PUBLICATIONS

European Search Report issued in EP Patent Application 14157771.8 dated Nov. 13, 2015.

OA1 issued in CN Patent Application Serial No. 201410093892.4 dated Feb. 29, 2016, 7 pages (Kenyon).

Pending Claims (in English) to OA1 issued in CN Patent Application Serial No. 201410093892.4 dated Feb. 29, 2016, 3 pages.

* cited by examiner

100

300

FINE TIMING ADJUSTMENT METHOD

BACKGROUND

The present invention relates to timing adjustment in multistage circuit systems.

Multistage circuit systems include several segments that are driven by signals. During circuit operation, a given number of segments may be driven by the signals. Ideally, the segment outputs need to be aligned with respect to time. However, with the continued increase in operating speed and desired output frequency in multistage circuits, timing related errors are the most challenging and demanding problems. These errors include phase noise on the clock signal, duty cycle distortion, and segment to segment timing mismatch.

Timing mismatch in multistage circuits, such as converters, causes frequency and data distortion. Existing schemes for fixing timing related errors are far too invasive and susceptible to noise. Some schemes require additional circuitry and control signals on a clock signal for every segment or include overly complex adjustment circuitry for every clock line. These schemes downgrade performance by providing additional coupling paths. Other schemes involve integrating varactors on each clocked line, however, they only allow fine resolution for small voltage adjustment. Moreover, because the varactor schemes utilize voltage for timing adjustment, they are more susceptible to noise.

The inventor therefore perceives a need in the art for improved fine timing adjustment in multistage circuits without the need for adding significant circuitry or control lines.

DETAILED DESCRIPTION

Embodiments of the present invention may provide non-invasive techniques for adjusting timing in multistage circuit systems. A multistage circuit system according to embodiments of the present invention may include a plurality of circuit stages coupled to signal lines that carry signals. The system may also include a plurality of load circuits, one provided in for each circuit stage. The load circuits may have inputs coupled to the signal lines that carry the signals. Each load circuit may include a current source programmable independently of the other load circuits that propagates current through an input transistor in the respective load circuit that receives the signal. The current propagating through the input transistor may provide a load on the corresponding signal line, allowing fine timing adjustment for each stage.

Figure 1:
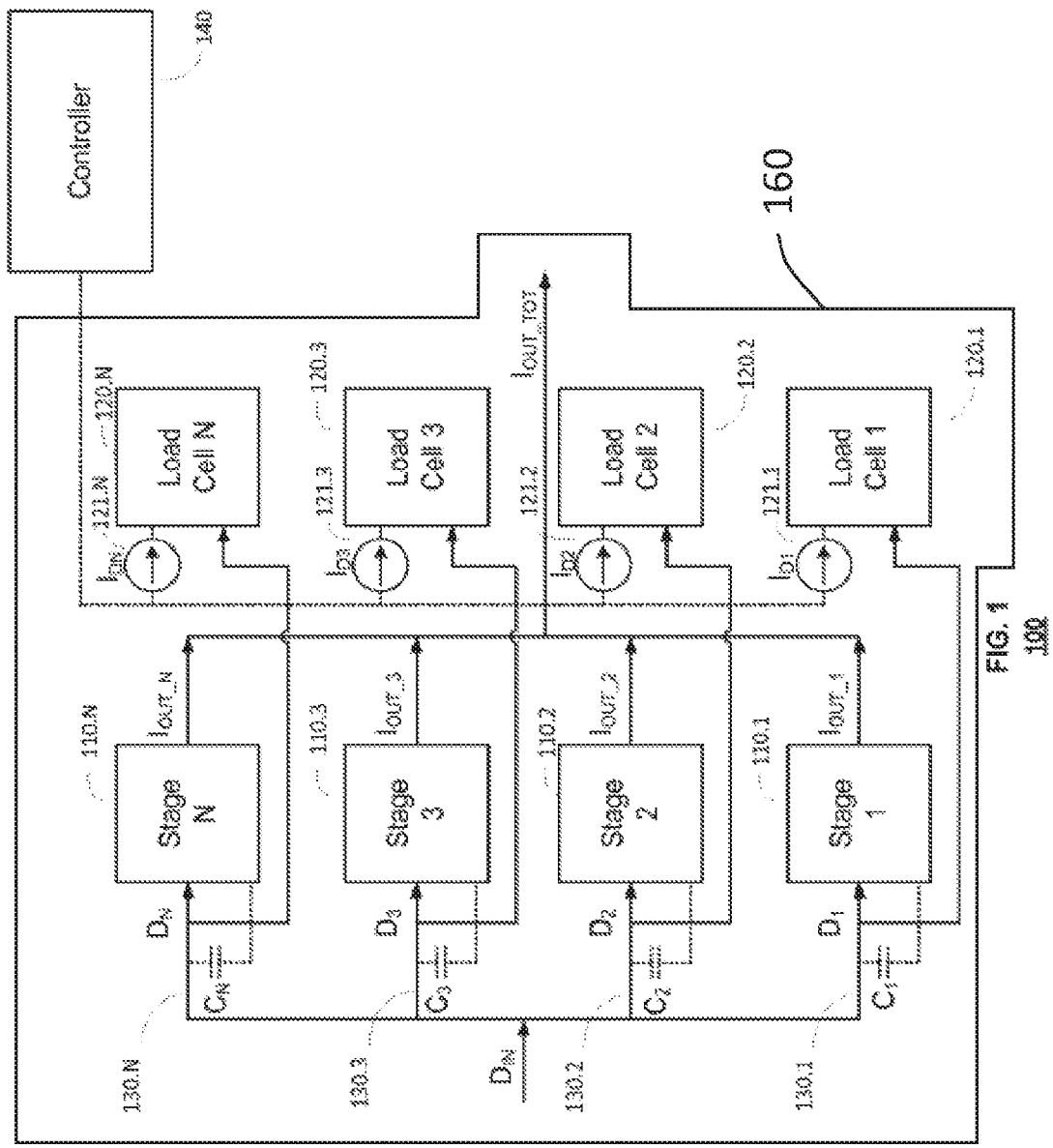
FIG. 1 is a block diagram of a multistage circuit system according to an embodiment of the present invention.

FIG. 1 is a block diagram of a multistage circuit system 100 according to an embodiment of the present invention. The system 100 may include a plurality of circuit stages 110.1-110.N, a plurality of load cells 120.1-120.N, one for each circuit stage, signal lines 130.1-130.N, and a controller 140. The signal lines 130.1-130.N may carry synchronous data signals $D_1$-$D_N$ (which may be bits of a signal $D_{IN}$) that, ideally, would be input to the circuit stages 110.1-110.N simultaneously with each other. Each signal line 130.1, . . . , 130.N is input to an associated circuit stage 110.1, . . . , 110.N and to an associated load cell 120.1, . . . , 120.N.

The signals $D_1$-$D_N$ may be data signals, clock signals, or other signals having transitions that would be input to the circuit stages 110.1-110.N simultaneously with each other, notwithstanding differences in conductor length, capacitive loading, or other variations among the signal lines 130.1-130.N. The load cells 120.1-120.N may be tunable devices that present a variable capacitive load to the signal lines 130.1-130.N, shown in FIG. 1 as variable capacitors $C_1$-$C_N$. The load cells 120.1-120.N, therefore, may present tunable capacitive loads to the signal lines 130.1-130.N that counteract effects that may cause transitions in the data signals $D_1$-$D_N$ to be received out of synchronism.

The load cells 120.1-120.N may have inputs coupled to the signal lines 130.1-130.N. Each load cell 120.1-120.N may include a programmable current source 121.1-121.N that generates a bias current $I_{D1}$-$I_{DN}$ through an input circuit (not shown) in a respective load stage 120.1, . . . , 120.N. The currents $I'_m$-$I_{DN}$ flowing through each load cell 120.1-120.N may define the capacitive load $C_1$-$C_N$ that is imposed on the signal lines 130.1-130.N. The load cells 120.1-120.N may have various circuit configurations. According to some embodiments of the present invention, the load cells 120.1-120.N may have circuit configurations that are similar to corresponding circuit stages 110.1-110.N. According to other embodiments of the present invention, the load cells 120.1-120.N may have circuit configurations that are not similar to corresponding circuit stages 110.1-110.N. The configuration of the load cells 120.1-120.N may be unique to the multistage circuit system they are being integrated into.

The controller 140 may be an on chip processor or state machine that stores drive strength values for the programmable current sources 121.1-121.N. The drive strength data may be derived from stored data, including estimates of signal mismatch that may be obtained, for example, from circuit simulations or test data. Moreover, the controller 140 may include, for example, any suitable processing platform, computing platform, computing device, processing device, computing system, processing system, computer, processor, or the like, and may be implemented using any suitable combination of hardware and/or software.

The principles of the present invention find application with a variety of circuit systems. In the system illustrated in FIG. 1, the circuit stages 110.1-110.N are shown as driving output currents $I_{OUT1}$-$I_{OUTN}$ to a common output node $I_{OUT-TOT}$ in response to a signal $D_{IN}$. However, the principles of the present invention also find application in circuit systems in which circuit stages generate output voltages in response to control signals or in which different circuit stages drive output signals, whether they be currents or voltages, to separate output nodes (e.g., analog-to-digital converters or digital-to-analog converters). In one embodiment, the circuit stages 110.1-110.N and the load cells 120.1-120.N are in an analog-to-digital converter. In one embodiment, the circuit stages 110.1-110.N and the load cells 120.1-120.N are in a digital-to-analog converter. In that regard, the structure and operation of the circuit stages is immaterial to the present discussion.

During operation, the bits $D_1$-$D_n$ of the signal $D_{IN}$ may drive the corresponding circuit stages 110.1-110.N during each operation, based on the value of the bits $D_1$-$D_N$. For example, for a given operation X of the multistage circuit system 100, if the bits $D_1$ and $D_N$ have a high value (1) and $D_2$ and $D_3$ have a low value (0), the circuit stages 110.1 and 110.N may be driven to output currents $I_{OUT\_1}$ and $I_{OUT\_N}$, respectively. The circuit stages 110.2 and 110.3 may not be driven if the bits $D_2$ and $D_3$ have a low value (in other words, $I_{OUT\_2}$ and $I_{OUT\_3}$ may be equal to 0). Consequently, for the operation X, the total output current $I_{OUT\_TOT}$ may equal $I_{OUT\_1}+I_{OUT\_N}$. The values of $D_1$-$D_N$ may vary during subsequent circuit operations, therefore, the output current $I_{OUT\_TOT}$ may also vary for those operations. As described below, the current $I_{D1}$-$I_{DN}$ flowing through each load cell 120.1-120.N may provide a capacitive load on the corresponding signal lines 130.1-130.N to minimize timing mismatch between the output currents $I_{OUT\_1}$-$I_{OUT\_N}$ for a given circuit operation.

Continuing with the example above, during the given operation X (where the bits $D_1$ and $D_N$ have a high value and the bits $D_2$ and $D_3$ have a low value), the controller 140 may control the programmable current sources 121.1 and 121.N to generate the currents $I_{D1}$ and $I_{DN}$ respectively, based on the existing mismatch data. The currents $I_{D1}$ and $I_{DN}$ flowing through the respective load cells 120.1 and 120.N may define the capacitive loads $C_1$ and $C_4$ (shown in dashed lines) that are imposed on the signal lines 130.1 and 130.N, respectively. In this manner, the capacitive loads $C_1$ and $C_4$ provided on the signal lines $D_1$ and $D_4$ may be varied for the given operation X to allow fine timing adjustment between the circuit stages 110.1 and 110.N. In a similar fashion, during subsequent operations, the currents $I_{D1}$-$I_{D4}$ may provide capacitive loads on the signal lines 130.1-130.N (depending on which bits are high and which bits are low for the operation in question) to allow fine timing adjustment between the circuit stages 110.1-110.N of the system 100.

Figure 2A:
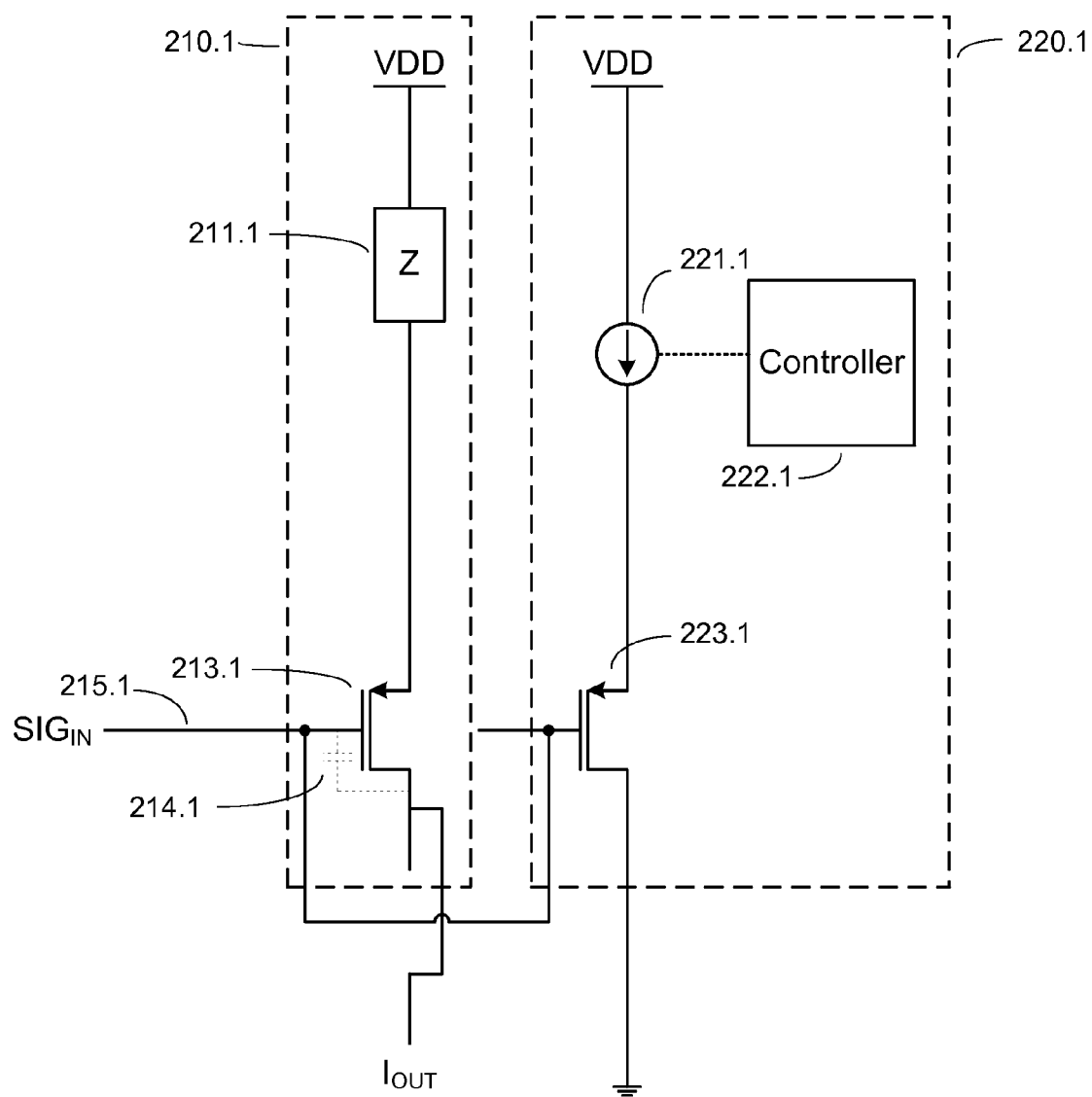
FIG. 2(a) is a block diagram of a single stage in a multistage circuit system according to an embodiment of the present invention.

FIGS. 2(a) and (b) are circuit diagrams each illustrating exemplary circuit stages and load stages according to embodiments of the present invention.

FIG. 2(a) is a block diagram of a circuit stage 210.1 and a load circuit 220.1 in a multistage circuit system according to an embodiment of the present invention. The load circuit 220.1 may be in parallel to the circuit stage 210.1. In other words, the inputs of the load circuit 220.1 and the circuit stage 210.1 may be coupled to a common signal line 115.1 that carries signal $SIG_{IN}$. Although FIG. 2(a) only shows one circuit stage 210.1 and one load circuit 220.1, a multistage circuit system according to embodiments of the present invention may include a plurality of circuit stages (210.1-210.N) and corresponding load circuits (220.1-220.N) in a configuration that may be similar to the multistage circuit system 100 in FIG. 1.

The circuit stage 210.1 may include an impedance 211.1 and a transistor 213.1 and. The transistor 213.1 may be p-type metal-oxide-semiconductor (PMOS) transistors, n-type metal-oxide-semiconductor (NMOS) transistors, or other types of transistors that are suitable for use in the circuit stage 210.1. The impedance 211.1 may be coupled to a voltage VDD on one end and a source terminal of the transistor 213.1 on the other end. A gate terminal of the transistor 213.1 may be coupled to the signal line 215.1.

The current flowing through the impedance 211.1 may be steered by the transistor 213.1, which may act as a switch. If the signal $SIG_{IN}$ is high, the transistor 213.1 may be switched on, and the current flowing through the impedance 211.1 may be output to a node $I_{OUT}$ by the circuit stage 210.1.

The load circuit 220.1 may include a programmable current source 221.1, a controller 222.1, and a transistor 223.1. The transistor 223.1 may be of a same type (PMOS, NMOS, etc.) as the transistor 213.1 in the circuit stage 210.1. The programmable current source 221.1 may be similar to the programmable current sources 121.1-121.N in FIG. 1. The controller 222.1 may be similar to the controller 140 in FIG. 1 and may govern a bias current generated by the programmable current source 221.1 based on stored timing mismatch data.

The programmable current source 221.1 may be coupled to a voltage VDD on one end and a source terminal of the transistor 223.1 on the other end. A gate terminal of the transistor 223.1 may be coupled to signal line 215.1 and a drain terminal of the transistor 223.1 may be coupled to ground. If the signal $SIG_{IN}$ is high, the transistor 223.1 may be switched on, and the current generated by the programmable current source 221.1 may flow through transistor 223.1 towards ground.

During operation, the controller 222.1 may control the programmable current source 221.1 to generate a bias current based on the existing mismatch data. When the signal $SIG_{IN}$ is high, the bias current may flow through the transistor 223.1 toward ground and may define a gate-to-drain capacitance 214.1 (shown in dashed lines) of the transistor 213.1. In this manner, a capacitive load 214.1 may be provided on signal line 215.1 to allow fine timing adjustment of the circuit stage 210.1. The controller 222.1 may vary the load presented on the signal line 215.1 by adjusting the bias current generated by the programmable current source 221.1. The same timing adjustment scheme may be used in the other circuit stages 210.2-210.N (not shown) of a multistage circuit system.

Figure 2B:
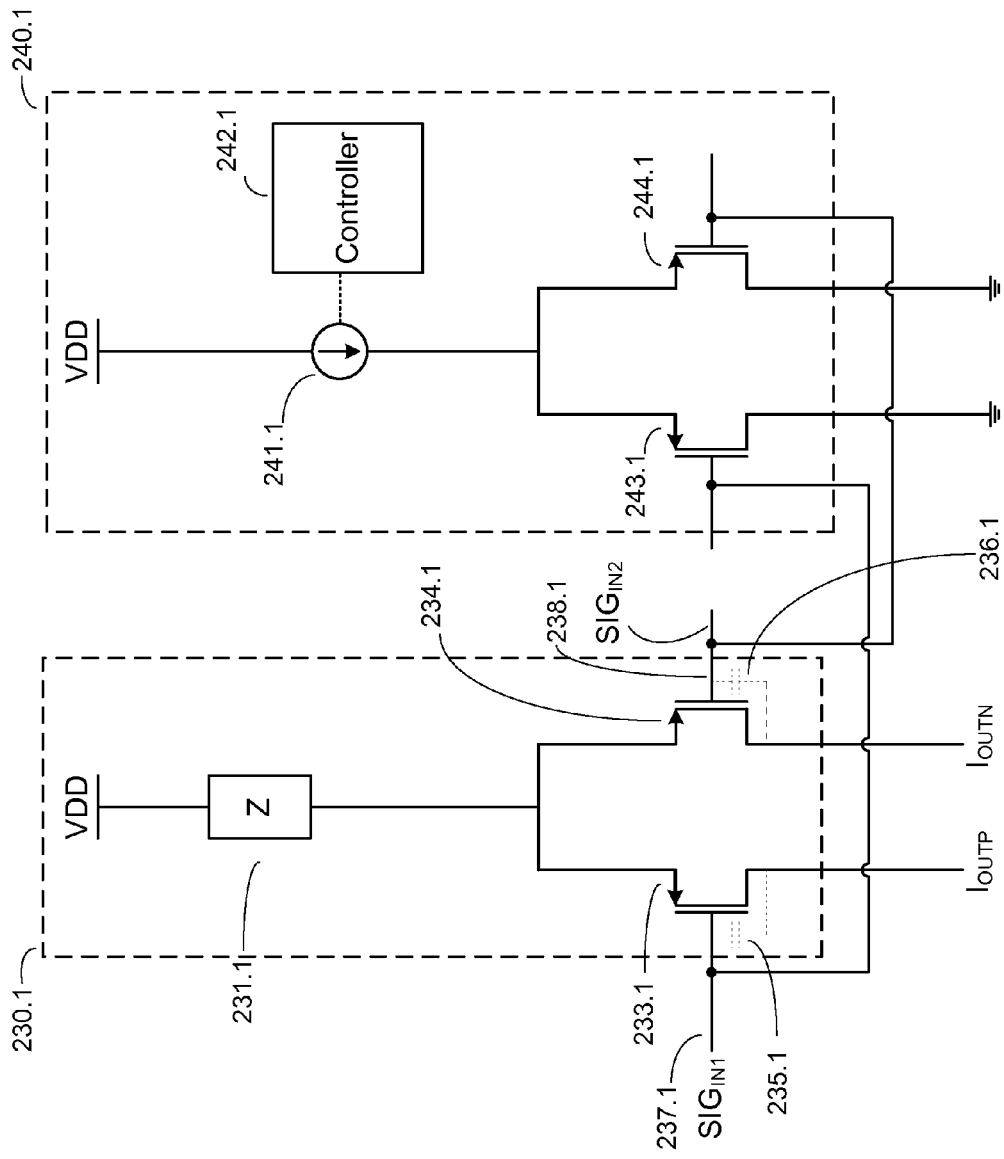
FIG. 2(b) is a block diagram of a single stage in a multistage circuit system according to an embodiment of the present invention.

FIG. 2(b) is a block diagram of a circuit stage 230.1 and a corresponding load circuit 240.1 according to another embodiment of the present invention. The circuit stage 230.1 is a differential version of the circuit stage 210.1 in FIG. 2(a). Similarly, the load circuit 240.1 is a differential version of the load circuit 220.1 of FIG. 2(a). According to this embodiment, the load circuit 240.1 may be in parallel to the circuit stage 230.1. Although FIG. 2(b) only shows one circuit stage 230.1 and one load circuit 240.1, a multistage circuit system according to embodiments of the present invention may include a plurality of circuit stages (230.1-230.N) and corresponding load circuits (240.1-240.N) in a configuration that may be similar to the multistage circuit system 100 in FIG. 1.

The circuit stage 230.1 may include an impedance 231.1 and transistors 233.1-234.1. The transistors 233.1-234.1 may be PMOS transistors, NMOS transistors, or other types of transistors that are suitable for use in the circuit stage 230.1. The impedance 231.1 may be coupled to a voltage VDD on one end and source terminals of the transistors 233.1 and 234.1. A gate terminal of the transistor 233.1 may be coupled to a signal line 237.1 that carries a signal $SIG_{IN1}$. Similarly, a gate terminal of the transistor 234.1 may be coupled a signal line 238.1 that carries a signal $SIG_{IN2}$.

The transistors 233.1 and 234.1 may act as switches to steer a current flowing through the impedance 231.1. If the signal $SIG_{IN1}$ is high, the transistor 233.1 may be switched on, and the current flowing through impedance 231.1 may be steered to an output $I_{OUTP}$. Alternatively, if the signal $SIG_{IN2}$ is high, the transistor 234.1 may be switched on, and the current flowing through the transistor 231.1 may be steered to an output $I_{OUTN}$.

The load circuit 240.1 may include a programmable current source 241.1, a controller 242.1, and a pair of transistor 243.1 and 244.1. The transistors 243.1 and 244.1 may be of a same type (PMOS, NMOS, etc.) as the transistors 233.1 and 234.1 in the circuit stage 230.1. The programmable current source 241.1 may be similar to the programmable current sources 121.1-121.N in FIG. 1. The controller 242.1 may be similar to the controller 140 in FIG. 1 and may govern a bias current generated by the programmable current source 241.1 based on stored timing mismatch data.

The programmable current source 241.1 may be coupled to VDD on one end and a source terminal of each transistor 243.1 and 244.1 on the other end. A gate terminal of the transistor 243.1 may be coupled to the signal line 2371.1 and a drain terminal of the transistor 243.1 may be coupled to ground. Similarly, a gate terminal of the transistor 244.1 may be coupled to the signal line 238.1 and a drain terminal of the transistor 244.1 may be coupled to ground.

During operation, the controller 242.1 may control the programmable current source 241.1 to generate a bias current based on the existing mismatch data. If the signal $SIG_{IN1}$ is high, the bias current may flow through the transistor 243.1 to ground and define a gate-to-drain capacitance 235.1 (shown in dashed lines) of the transistor 233.1. Alternatively, if the signal $SIG_{IN2}$ is high, the bias current may flow through the transistor 244.1 to ground and may define a gate-to-drain capacitance 236.1 (shown in dashed lines) of the transistor 234.1. In this manner, a capacitive load may be provided on the signal lines 237.1 and 238.1 to allow fine timing adjustment of the circuit stage 230.1. The controller 242.1 may vary the load presented on the signal lines 237.1 and 238.1 by adjusting the bias current generated by the programmable current source 241.1. The same adjustment scheme may be used in the other circuit stages 220.2-220.N (not shown) of a multistage circuit system.

Figure 3:
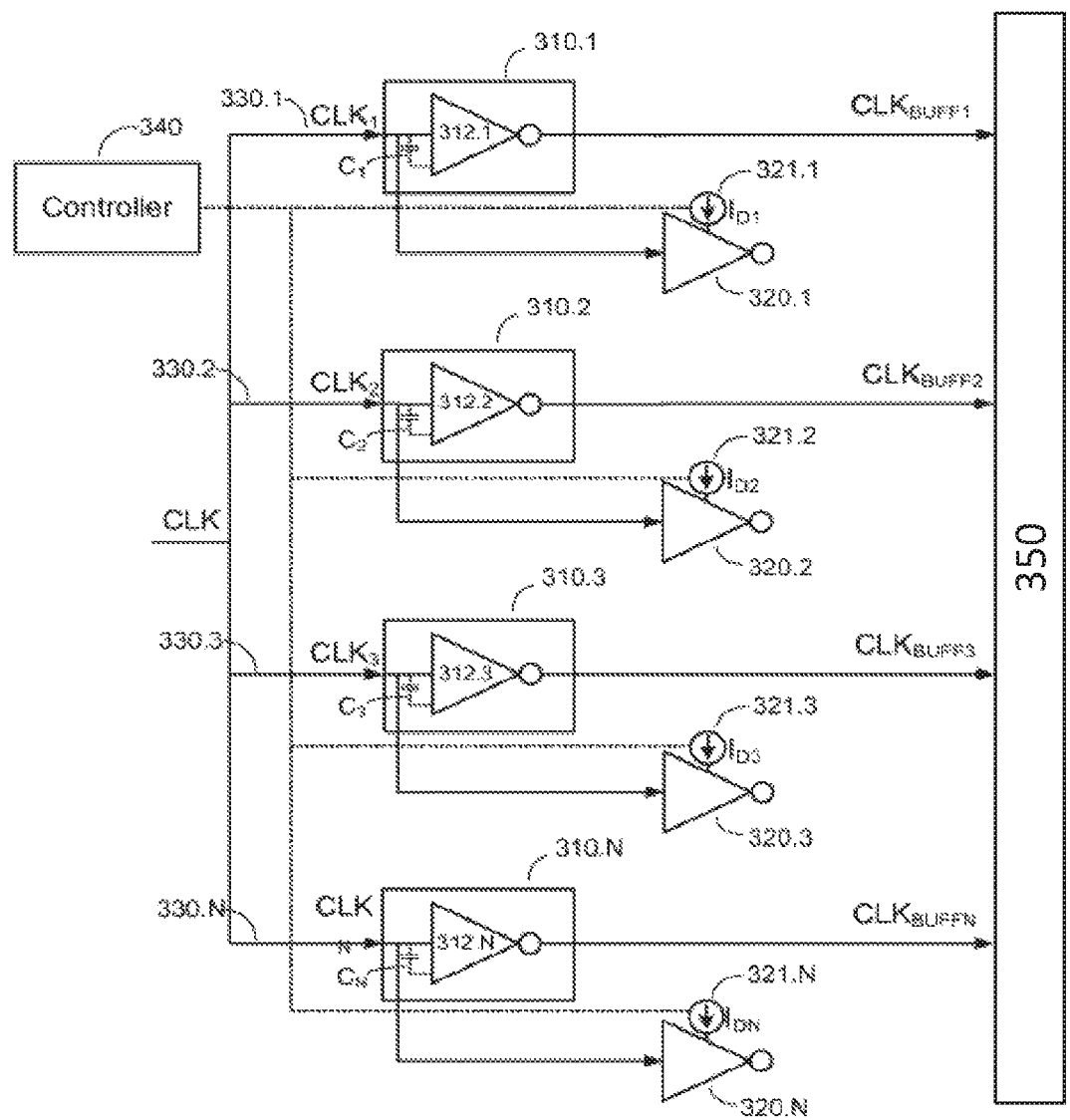
FIG. 3 is a block diagram of a clock distribution circuit according to an embodiment of the present invention.

FIG. 3 is a block diagram of a multistage clock distribution circuit 300 according to an embodiment of the present invention. The clock distribution circuit 300 may include a plurality of buffer circuits 310.1-310.N, a plurality of load inverters 320.1-320.N, one for each buffer circuit 310.1-310.N, signal lines 330.1-330.N, and a controller 340. The signal lines 330.1-330.N may carry synchronous clock signals $CLK_1$-$CLK_N$ (which represent distributed versions of the clock signal CLK that are present at each buffer 310.1-310.N) that, ideally, would be input to the buffers 310.1-310.N simultaneously with each other. Each signal line 330.1, . . . , 330.N is input to an associated buffer 310.1, . . . , 310.N and to an associated load inverter 320.1, . . . , 320.N.

Ideally, the distributed clock signals $CLK_1$-$CLK_N$ would be input the buffers 310.1-310.N simultaneously with each other, notwithstanding differences in conductor length, capacitive loading, or other variations among the signal lines 330.1-330.N. The load inverters 320.1-320.N may be tunable devices that present a variable capacitive load to the signal lines 330.1-330.N, shown in FIG. 3 as variable capacitors $C_1$-$C_N$. The load inverters 320.1-320.N, therefore, may present tunable capacitive loads to the signal lines 330.1-330.N that counteract some other effects that may cause transitions in the clock signals $CLK_1$-$CLK_N$ to be received out of synchronism.

Each buffer 310.1-310.N may include an inverter 312.1-312.N. The buffers 310.1-310.N may each receive a distributed clock signal $CLK_1$-$CLK_N$ and output a corresponding buffered clock signal $CLK_{BUFF1}$-$CLK_{BUFF4}$. According to embodiments of the present invention, the buffered clock signals $CLK_{BUFF1}$-$CLK_{BUFF4}$ may be provided to 350, such as ADCs, DACs, or other components that may be driven by a clock signal.

The load inverters 320.1-320.N may have inputs coupled to the signal lines 330.1-330.N. Each load inverter 320.1-320.N may include a programmable current source 321.1-321.N that generates a bias current $I_{D1}$-$I_{DN}$ through an input circuit (not shown) in a respective load inverters 320.1, . . . , 320.N. The currents $I_{D1}$-$I_{DN}$ flowing through each load inverter 320.1-320.N may define the capacitive load $C_1$-$C_N$ that is imposed on the signal lines 330.1-330.N.

The controller 340 may be an on chip processor or state machine that stores drive strength values for the programmable current sources 321.1-321.N. The drive strength data may be derived from stored data, including estimates of signal mismatch that may be obtained, for example, from circuit simulations or test data. Moreover, the controller 340 may include, for example, any suitable processing platform, computing platform, computing device, processing device, computing system, processing system, computer, processor, or the like, and may be implemented using any suitable combination of hardware and/or software.

The principles of the present invention find application with a variety of circuit systems. In the system 300 illustrated in FIG. 3, the buffers 310.1-310.N are shown as providing a clock signal CLK (in a distributed form) to a plurality of circuits 350, such as ADCs or DACs. However, the principles of the present invention also find application in circuit systems including circuit stages that receive signals and are required to provide synchronized outputs in response to the signals. Examples of such circuits may include the embodiments described above with respect to FIGS. 1 and 2 (as well as other systems not specifically mentioned in this discussion).

During a given clock cycle Y, the controller 340 may control the programmable current sources 321.1-321.N to generate the bias currents $I_{D1}$-$I_{D4}$, respectively, based on the existing mismatch data. The bias currents $I_{D1}$-$I_{DN}$ flowing through the respective load inverters 321.1-321.N may define the capacitive loads $C_1$-$C_N$ (shown in dashed lines) to the signal lines 330.1-330.N. In this manner, a predetermined capacitive load may be provided to each signal line 330.1-330.N for a given clock cycle Y to allow fine timing adjustment between the buffers 310.1-310.N. In a similar fashion, during subsequent clock cycles, the bias currents $I_{D1}$-$I_{DN}$ may provide capacitive loads to the signal lines 330.1-330.N to allow fine timing adjustment for the clock distribution circuit 300. Consequently, the buffered clock signals $CLK_{BUFF1}$-$CLK_{BUFF4}$ may be aligned with respect to time.

Although the embodiments described above with respect to FIGS. 1-3 include load circuits for each circuit stage in a multistage circuit system, other embodiments may not require such a one-to-one configuration. In order to minimize costs and conserve space on a dye, some embodiments of the present invention may only require load circuits for selected circuit stages that need to be tuned. Embodiments of the present invention may therefore be configured to meet the needs of the system they are being integrated in.

Moreover, although the circuit stages and the load circuits described in FIGS. 2 and 3 are similar (e.g., similar structures and the same types of transistors), embodiments of the present invention are not limited to such configurations. The circuit stages and the load circuits need not be similar to each other (i.e., different circuit structures or configurations). According to other embodiments of the present invention, the load circuits may not be similar to the circuit stages, as long as the load circuits and the circuit stages are in parallel and the load circuits include programmable current sources to vary loads presented on signal lines carrying signals that are being input into the circuit stages.

Embodiments of the present invention provide techniques for very fine timing adjustment in the femto-second range. For example, say we have a given circuit stage in a multi-stage circuit system with an input transistor (similar to transistor 213.1 in FIG. 2(a)) having a width of 6.4 microns and a length of 0.08 microns. According to embodiments of the present invention, a load circuit with a corresponding input transistor (similar to transistor 223.1 in FIG. 2(a)) of a similar size (approximately 6.4 microns by 0.08 microns) may be placed in parallel to the circuit stage. Varying a current through the load circuit transistor may shift the timing of a signal (similar to $SIG_{IN}$ in FIG. 2(a)) being input to the circuit stage transistor and the load transistor by approximately 400 femto-seconds. Similarly, say we have a given circuit stage in a multistage circuit system with an input transistor having a width of 1.6 microns and a length of 0.08 microns. According to embodiments of the present invention, a load circuit with a corresponding input transistor, having a length of 11.2 microns and a width 0.08 microns, may be placed in parallel to the circuit stage. Varying a current through the load circuit transistor may shift the timing of a signal being input to the circuit stage transistor and the load transistor by approximately 1.5 pico-seconds.

The benefit of the described techniques is the ability to provide fine adjustment without the need to add significant circuitry or control lines. Moreover, the techniques described above are not as susceptible to noise errors as traditional timing adjustment methods.

Although the foregoing techniques have been described above with reference to specific embodiments, the invention is not limited to the above embodiments and the specific configurations shown in the drawings. For example, some components shown may be combined with each other as one embodiment, or a component may be divided into several subcomponents, or any other known or available component may be added. Those skilled in the art will appreciate that these techniques may be implemented in other ways without departing from the spirit and substantive features of the invention. The present embodiments are therefore to be considered in all respects as illustrative and not restrictive.

We claim:

1. An integrated circuit, comprising:
   a circuit system having a plurality of circuit stages to receive respective input data signals and to generate respective circuit stage output data signals; and
   a plurality of load circuits, one provided for each circuit stage, having inputs for the input data signals, each load circuit having a current source and a transistor that receives the input data signal, the current source, programmable independently of the current sources of other load circuits, to propagate a current through the transistor that receives the input data signal to impose a load on a signal line that carries the input data signal received by the load circuit;
   wherein for at least one of the load circuits, the load circuit is not directly coupled to a signal line that carries the output data signal generated by the circuit stage for which the load circuit is provided.

2. The integrated circuit of claim 1, further comprising a controller to vary the current propagated by each current source to account for timing mismatch between the circuit stages.

3. The integrated circuit of claim 1, wherein the circuit stages and the load circuits include a plurality of transistors of a common MOS type.

4. The integrated circuit of claim 2, wherein the currents propagated by the current sources define capacitive loads imposed on the signal lines that carry the input data signals.

5. The integrated circuit of claim 1, wherein the circuit stages and the load circuits are in an analog-to-digital converter.

6. The integrated circuit of claim 1, wherein the circuit stages and the load circuits are in a digital-to-analog converter.

7. A method comprising:
   receiving a plurality of input data signals at corresponding circuit stages;
   generating a plurality of output signals based on the input data signals at the corresponding circuit stages;
   receiving input data signals by load circuits, in parallel to selected circuit stages, at respective input transistors in the load circuits, wherein for at least one of the load circuits, the load circuit is not directly coupled to a signal line that carries the output signal generated by the circuit stage to which the load circuit is provided; and
   driving respective bias currents through the input transistors of the load circuits to counteract timing mismatch between the input data signals.

8. The method of claim 7, wherein the selected circuit stages and the load circuits include a plurality of transistors of a common MOS type.

9. The method of claim 7, further comprising:
   altering, by the bias current propagating through the input transistor of each load circuit, a load on a signal line that carries the input data signal received by the load circuit; and
   varying, by a controller, the bias current in each load circuit based on values of the input data signals.

10. The method of claim 7, wherein the selected circuit stages and the load circuits are in an analog-to-digital converter.

11. The method of claim 7, wherein the circuit stages and the load circuits are in a digital-to-analog converter.

12. A digital-to-analog converter comprising:
   a circuit system having a plurality of circuit stages to receive respective input data bits and to generate respective circuit stage current output signals based on the respective value of the input data bit, the respective circuit stage current output signals being combined at a common output node to generate a total output current;
   a plurality of load circuits, one for each circuit stage, having inputs for the respective input data bits, each load circuit having a programmable current source that propagates a current through a transistor that receives the respective input data bit to impose a load on a signal line that carries the input data bit received by the load circuit; and
   a controller to vary the current propagated by each programmable current source to vary the load and reduce timing mismatch between the circuit stages.

13. The digital-to-analog converter of claim 12, wherein the circuit stages and the load circuits include a plurality of transistors of a common MOS type.

14. The digital-to-analog converter of claim 12, wherein the currents propagated by the current sources define a gate-to-drain capacitance of a transistor in the circuit stage receiving a respective input data bit.

15. The digital-to-analog converter of claim 12, wherein:
the digital-to-analog converter receives buffered clock signals generated by buffers receiving respective synchronous clock signals in a clock distribution circuit, wherein the buffers also has corresponding load circuits; and
the load circuits further includes load inverters corresponding to the buffers, wherein load inverters having respective inputs for receiving respective synchronous clock signals.

16. The digital-to-analog converter of claim 15, wherein each load inverter has a corresponding programmable current source that generates a bias current that flows through the load inverter.

17. The digital-to-analog converter of claim 16, wherein respective bias currents define respective capacitive loads on respective signal lines carrying respective synchronous clock signals received by respective load inverters.

18. The digital-to-analog converter of claim 12, wherein the controller controls the current generated by each programmable current source based on values of the input data bits.

19. The digital-to-analog converter of claim 12, wherein for at least one of the load circuits, the load circuit is not directly coupled to a signal line that carries the circuit stage current output signal generated by the circuit stage for which the load circuit is provided.

* * * * *